US012581783B2

(12) United States Patent
Wang et al.

(10) Patent No.: US 12,581,783 B2
(45) Date of Patent: Mar. 17, 2026

(54) LIGHT SOURCE MODULE AND DISPLAY DEVICE

(71) Applicant: HUIZHOU CHINA STAR OPTOELECTRONICS DISPLAY CO., LTD., Huizhou (CN)

(72) Inventors: Xinyu Wang, Huizhou (CN); Guofeng Kuang, Huizhou (CN); Yuqing Geng, Huizhou (CN)

(73) Assignee: HUIZHOU CHINA STAR OPTOELECTRONICS DISPLAY CO., LTD., Huizhou (CN)

( * ) Notice: Subject to any disclaimer, the term of this patent is extended or adjusted under 35 U.S.C. 154(b) by 0 days.

(21) Appl. No.: 17/759,646

(22) PCT Filed: Jul. 5, 2022

(86) PCT No.: PCT/CN2022/103954
§ 371 (c)(1),
(2) Date: Jul. 28, 2022

(87) PCT Pub. No.: WO2023/240716
PCT Pub. Date: Dec. 21, 2023

(65) Prior Publication Data
US 2024/0186478 A1 Jun. 6, 2024

(30) Foreign Application Priority Data
Jun. 16, 2022 (CN) .......................... 202210684698.8

(51) Int. Cl.
*H10H 20/858* (2025.01)
*H10H 20/841* (2025.01)
(Continued)

(52) U.S. Cl.
CPC ...... *H10H 20/8585* (2025.01); *H10H 20/852* (2025.01); *H10H 20/857* (2025.01)

(58) Field of Classification Search
CPC ....... H01L 33/647; H01L 33/52; H01L 33/62; H01L 33/486; H01L 2224/02371;
(Continued)

(56) References Cited

U.S. PATENT DOCUMENTS 6,774,315 B1 * 8/2004 Pierson ................ H05K 7/1061
257/774
2009/0090540 A1 4/2009 Tullidge et al.
(Continued)

FOREIGN PATENT DOCUMENTS

CN          202889784 U          4/2013
CN          106838836 A          6/2017
(Continued)

OTHER PUBLICATIONS

International Search Report in International application No. PCT/CN2022/103954, mailed on Nov. 25, 2022.
(Continued)

*Primary Examiner* — Monica D Harrison
*Assistant Examiner* — Moataz Khalifa

(57) ABSTRACT

The embodiment of the disclosure provides a light source module and a display device. The light source module includes a substrate, a pad, a light emitting unit, and a cover layer, and at least one opening is provided on the pad. The opening and a via hole are provided on the pad. A cover layer is provided on the substrate. Metal material with good heat dissipation performance is filled in the corresponding opening or via hole. When the light emitting unit operates for a long time, the display device has a good heat dissipation effect, thereby improving the comprehensive performance.

8 Claims, 4 Drawing Sheets

(51) Int. Cl.

*H10H 20/85*       (2025.01)
    *H10H 20/852*     (2025.01)
    *H10H 20/857*     (2025.01)

(58) Field of Classification Search

CPC ....... H01L 2224/02372; H01L 2224/01; H01L
                2224/02; H01L 2224/0212; H01L
                           2224/02123

See application file for complete search history.

(56) References Cited

U.S. PATENT DOCUMENTS

| | | | |
|---|---|---|---|
| 2011/0156083 A1 | 6/2011 | Wang et al. | |
| 2015/0348912 A1 | 12/2015 | Su et al. | |
| 2015/0349223 A1 | 12/2015 | Lee | |
| 2016/0029485 A1* | 1/2016 | Dummer .............. | H05K 1/0295 |
| | | | 362/382 |
| 2017/0331021 A1 | 11/2017 | Chae et al. | |
| 2018/0323236 A1 | 11/2018 | Oh et al. | |

FOREIGN PATENT DOCUMENTS

| | | | | |
|---|---|---|---|---|
| CN | 109155346 A | 1/2019 | | |
| CN | 110073505 A | 7/2019 | | |
| CN | 111952271 A | 11/2020 | | |
| CN | 212324452 U | 1/2021 | | |
| CN | 113130462 A | 7/2021 | | |
| CN | 113363363 A | 9/2021 | | |
| CN | 113903843 A | 1/2022 | | |
| JP | 2017092477 A | 5/2017 | | |
| WO | WO-2022057937 A1 * | 3/2022 | ........... | G02B 6/0068 |

OTHER PUBLICATIONS

Written Opinion of the International Search Authority in International application No. PCT/CN2022/103954, mailed on Nov. 25, 2022.

Chinese Office Action issued in corresponding Chinese Patent Application No. 202210684698.8 dated Jul. 30, 2023, pp. 1-8.

\* cited by examiner

LIGHT SOURCE MODULE AND DISPLAY DEVICE

FIELD OF INVENTION

The present disclosure relates to a field of manufacturing technology of a light source module and a display panel, in particular to a light source module and a display device.

BACKGROUND OF INVENTION

With the development of the manufacturing technology of the display panel, users have put forward higher requirements for the light emitting effect of the light source module and the display effect and the comprehensive performance of the corresponding display device.

Due to the advances in the manufacturing technology of light emitting diode (LED) display panels, the corresponding luminous brightness is greatly improved, and at the same time, the service life of the LED display panel is prolonged, and the production cost thereof is gradually reduced. With the further development of the LED display manufacturing technology, LEDs are gradually developing towards miniaturization and integration. In the prior art, when forming an LED display panel, a plurality of LED devices are usually provided directly on a light source module, for example, the LED devices are directly welded on the module through pads. When the LEDs operate and illuminate for a long time, the plurality of LEDs generate more heat inside the module. At the same time, in the prior art, the arrangement and structure of the modules or the LEDs are unreasonable, so that excess heat cannot be effectively diffused out of the module. With the prolongation of the service time, it is easy to cause the temperature of the device to be too high, thereby reducing the service life and the display effect of the display panel, which is not conducive to further improvement of the comprehensive performance of the display panel.

There is therefore a need for solutions to the problems of the prior art.

SUMMARY OF INVENTION

Technical Problem

In view of the foregoing, the flexible display panel provided in the prior art has a relatively thicker structure of a flexible folding module inside the flexible display panel, which is unreasonable in design, and is unfavorable for improving the comprehensive performance of the display panel.

Technical Solution

In view of the foregoing, an embodiment of the present disclosure provides a light source module and a display device, so as to effectively improve the structure of the light source module inside a display panel, reduce the internal temperature of the device during operation, and improve the display effect of the display panel.

To solve the above technical problem, the present disclosure provides a light source module including:

a substrate;

pads disposed on the substrate;

a light emitting unit disposed at least on the pads;

wherein the pads comprise a first pad and a second pad disposed at a side of the first pad, a space is provided between the first pad and the second pad, and the first pad and the second pad are provided with at least one opening;

Wherein the opening on the first pad and the opening on the second pad are symmetrically disposed with respect to the space.

According to an embodiment of the present disclosure, the openings are defined at sides of the first pad and the second pad facing the space, respectively, and the openings extend along a side edge of the pad and toward a middle region of the pad.

According to an embodiment of the present disclosure, the pads further comprise back pads disposed on a side of the substrate away from the light emitting unit, and the back pads are disposed corresponding to the first pad and the second pad.

According to an embodiment of the invention, an area of the back pad is smaller than an area of a corresponding first pad or a corresponding second pad.

According to an embodiment of the present disclosure, the pads is further provided with at least one via hole, and the via hole is filled with metal material.

According to an embodiment of the present disclosure, the openings comprises non-filling openings and filling openings, and wherein the filling openings are filled with metal material.

According to an embodiment of the present disclosure, the non-filling openings are parallel to and spaced from the filling openings, and the non-filling openings and the filling openings are distributed with respect to a center of the pad toward an edge of the pad.

According to an embodiment of the present disclosure, the first pad and the second pad further comprise a flat portion and an annular portion arranged around the flat portion; and wherein the flat portion is electrically connected to the annular portion.

According to an embodiment of the present disclosure, openings are defined in a corresponding region between the annular portion and the flat portion, and the openings are distributed to be centrally symmetric with respect to a center of the first pad or the second pad.

According to a second aspect of an embodiment of the present disclosure, there is provided a light source module comprising:

a substrate;

pads disposed on the substrate;

a light emitting unit disposed at least on the pads;

wherein the pads comprise a first pad and a second pad disposed on a side of the first pad, a space is provided between the first pad and the second pad, and the first pad and the second pad are provided with at least one opening.

According to an embodiment of the present disclosure, the openings are defined at sides of the first pad and the second pad facing the space, respectively, and the openings extend along a side edge of the pad and toward a middle region of the pad.

According to an embodiment of the present disclosure, the pads further comprise back pads disposed on a side of the substrate away from the light emitting unit, and the back pads are disposed corresponding to the first pad and the second pad.

According to an embodiment of the present disclosure, the pads is further provided with at least one via hole, and the via hole is filled with metal material.

According to an embodiment of the present disclosure, the openings comprise non-filling openings and filling openings, and wherein the filling openings are filled with metal material.

According to an embodiment of the present disclosure, the non-filling openings are parallel to and spaced from the filling openings, and the non-filling openings and the filling openings are distributed with respect to a center of the pad toward an edge of the pad.

According to an embodiment of the present disclosure, the first pad and the second pad further comprise a flat portion and an annular portion arranged around the flat portion; and wherein the flat portion is electrically connected to the annular portion.

According to an embodiment of the present disclosure, openings are defined in a corresponding region between the annular portion and the flat portion, and the openings are distributed to be centrally symmetric with respect to a center of the first pad or the second pad.

According to an embodiment of the present disclosure, the light source module further comprises: a cover layer disposed on the substrate and covering the light emitting unit, Wherein the cover layer comprises:

a first cover layer disposed at least on the substrate;

a second cover layer disposed at least on the first cover layer; and

Wherein the first cover layer is disposed around the light emitting unit, and the second cover layer covers the light emitting unit.

According to an embodiment of the present disclosure, wherein material of the first cover layer comprises any one of white ink and reflective ink, and the second cover layer comprises any one of silica gel and clear glue.

According to a third aspect of the embodiment of the present disclosure, there is further provided a display device comprising:

a light source module; and a functional film layer disposed on the light source module;

Wherein the light source module comprises a substrate and light emitting units, the light emitting units are arranged on the substrate in an array form, the light source module is configured to provide light to the functional film layer, and this light source module is the light source module provided in the embodiment of the present disclosure.

Advantageous Effects

Advantageous effects of embodiments of the present disclosure: compared with the prior art, an embodiment of the present disclosure provides a light source module and a display device, the light source module includes a substrate, a pad, a light emitting unit, and a cover layer, wherein the light emitting unit is correspondingly provided on the pad, and at least one opening is provided on the pad. In the embodiment of the present disclosure, an opening and a via hole are provided on a corresponding pad, and at the same time, a cover layer is provided on the substrate, and metal material with good heat dissipation performance is filled in the corresponding opening or the via hole. When the light emitting unit operates for a long time, excess heat generated inside the device may be dissipated through structures such as a metal material, an opening, and a corresponding cover layer, thereby protecting the display device. Therefore, the heat dissipation performance and the service life comprehensive performance of the display device are effectively improved.

DETAILED DESCRIPTION OF EMBODIMENTS

The following description of the embodiments is made with reference to the accompanying drawings to illustrate specific embodiments in which the present disclosure may be practiced.

When the display panel is in normal operation, a large number of light emitting diodes generate more heat inside the panel, thereby causing the LEDs and other devices inside the module to have excessively high temperature, excessive light decay, aging and yellowing, and degrading the service life and the display effect of the display panel.

An embodiment of the present disclosure provides a light source module and a display device to effectively solve the problems of excessively high temperature and severe aging of a device caused by internal heat accumulation during long-time operation of a display panel, and effectively improve the service life and comprehensive performance of the display panel.

Figure 1:
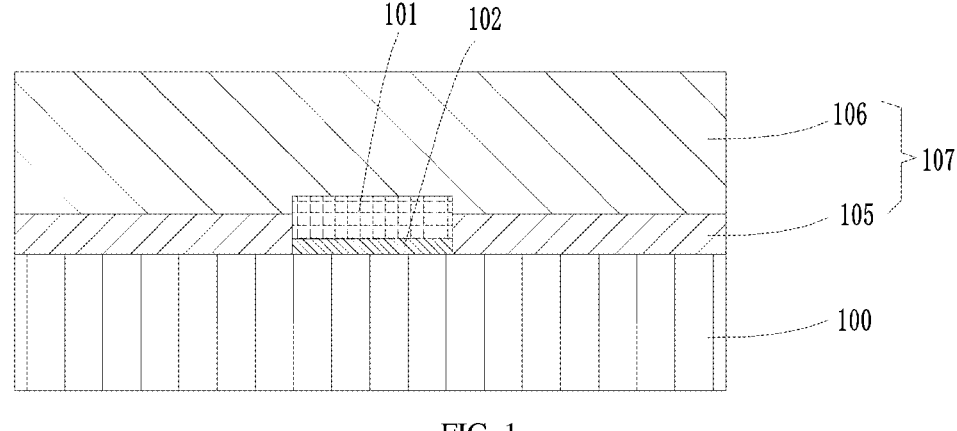
FIG. 1 is a schematic cross-sectional view of a light source module according to an embodiment of the present disclosure.

As shown in FIG. 1, FIG. 1 is a schematic cross-sectional view of a light source module according to an embodiment of the present disclosure. Specifically, the light source module includes a substrate 100, a pad 102, a light emitting unit 101, and a cover layer 107. Specifically, the pad 102 is provided on the substrate 100, and the light emitting unit 101 is provided on the pad 102. Meanwhile, the cover layer 107 is provided on the substrate 100, and the cover layer 107 completely covers the light emitting unit 101.

In an embodiment of the present disclosure, when light emitting units 101 of the light source module are provided, the light emitting units 101 may be arranged on the substrate 100 in an array form. For example, the light emitting units 101 are arranged in the row and column directions on the substrate 100. The distance and position between the two adjacent light emitting units 101 may be set according to the requirements of the actual product.

When manufacturing and forming the display panel, the light emitting unit 101 is welded to the corresponding pad 102, so as to realize the fixation and electrical connection of the light emitting unit 101. Meanwhile, the light emitting unit 101 is encapsulated and protected by the cover layer 107.

Figure 2:
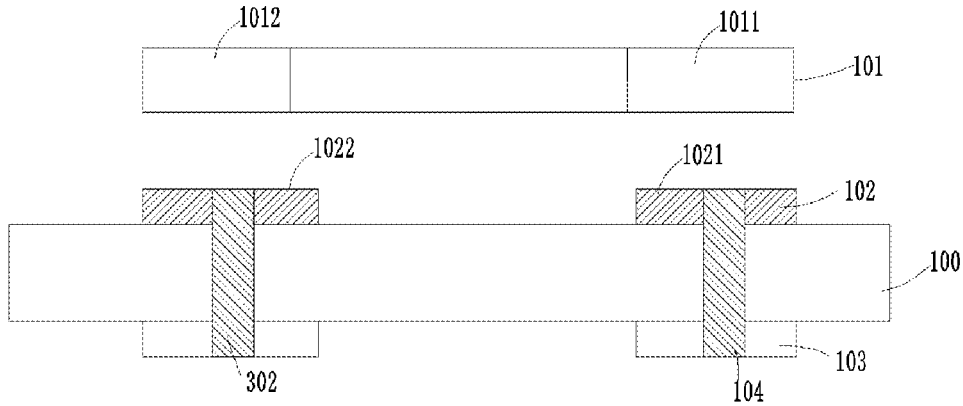
FIG. 2 is an exploded structural diagram of the light source module according to an embodiment of the present disclosure.

Preferably, as shown in FIG. 2, FIG. 2 is an exploded structural diagram of the light source module according to an embodiment of the present disclosure. In conjunction with the film layer structure in FIG. 1, in an embodiment of the present disclosure, the light emitting unit 101 may be a light emitting device such as a light emitting diode or a micro light emitting diode. In the following embodiment, a micro light emitting diode is used as an example for description.

The light emitting unit 101 includes a first electrode 1011 and a second electrode 1012. The first electrode 1011 and the second electrode 1012 may be located on both sides of the main body portion of the light emitting unit 101. Preferably, the first electrode 1011 may correspond to the anode of the light emitting diode, while the second electrode 1012 may correspond to the cathode of the light emitting diode.

Accordingly, pads 102 are described by using a first pad 1021 and a second pad 1022 as examples. The first pad 1021 is provided at one side of the second pad 1022, and a space is provided between the first pad 1021 and the second pad 1022 so as not to be connected therebetween, while the first pad 1021 and the second pad 1022 are provided corresponding to the first electrode 1011 and the second electrode 1012, respectively.

When welding is performed, the first electrode 1011 of the light emitting diode is welded to the first pad 1021, and the second electrode 1012 of the light emitting diode is welded to the second pad 1022.

Preferably, in an embodiment of the present disclosure, in order to improve the heat dissipation function of the light source module in operation, the first pad 1021 and the second pad 1022 are further defined with at least one opening structure during the arranging.

Figures 3, 4:
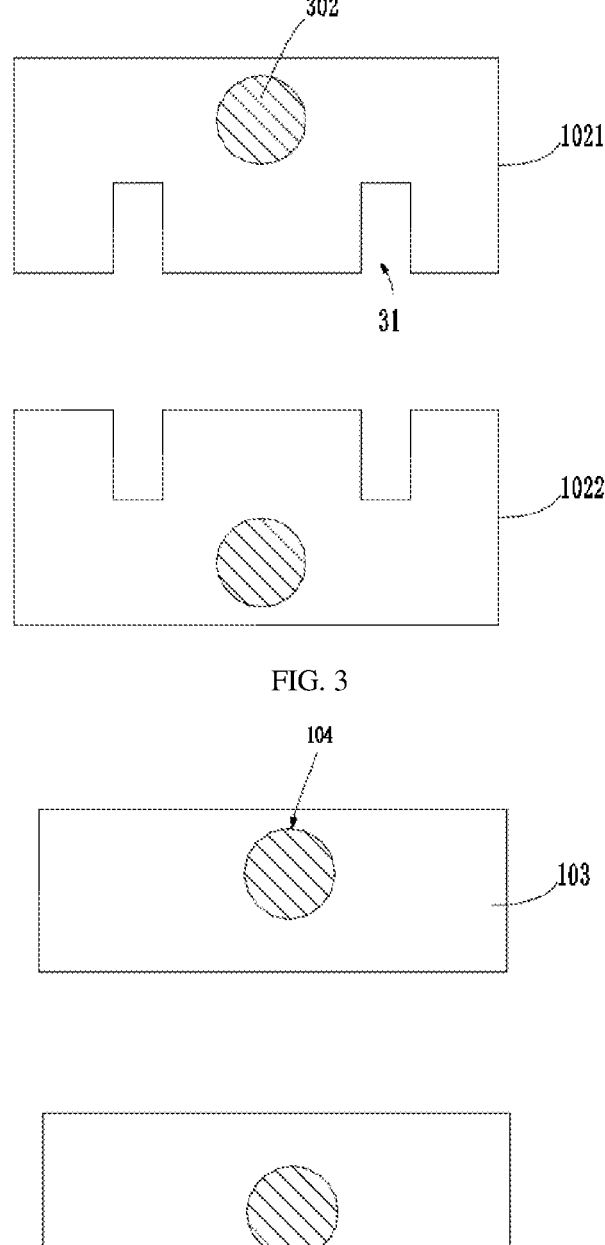
FIG. 3 is a schematic diagram of a structure of a pad according to an embodiment of the present disclosure.
FIG. 4 is a schematic structural diagram of a back pad according to an embodiment of the present disclosure.

Specifically, as shown in FIG. 3, FIG. 3 is a schematic diagram of a structure of a pad provided in an embodiment of the present disclosure. The first pad 1021 and the second pad 1022 are disposed opposite to each other, for example, the first pad 1021 and the second pad 1022 are disposed symmetrically on the substrate, so that the distribution of devices inside the module is more reasonable.

Meanwhile, in an embodiment of the present disclosure, at least one opening 31 is defined in each of the first pad 1021 and the second pad 1022. Specifically, the opening 31 may be provided at sides of the first pad 1021 and the second pad 1022 toward the space, and the opening 31 extends along the side edge of each pad toward the middle region of the pad. Thus, the opening 31 is made to have a certain depth, and a structure as shown in FIG. 3 is formed. In FIG. 3, two openings 31 are defined in each pad, and each opening 31 has the same shape and size. Preferably, different numbers and sizes of openings may be defined in each pad according to the size and operating conditions of the actual product, and details are not described herein.

When a plurality of openings 31 are defined, a comb structure is formed on the pad by the plurality of openings 31, and when heat accumulated on the pad is too high, a circulation effect may occur at the openings 31 to improve the heat dissipation effect of the device.

See the structure shown in FIG. 2 for details, in an embodiment of the present disclosure, the pad 102 further includes a back pad 103. The back pad 103 and the first and second pads 1021 and 1022 are provided on both sides of the substrate 100, respectively. Specifically, the first pad 1021 and the second pad 1022 are provided on the same side as the light emitting unit 101, while the back pad 103 is provided on the side surface of the substrate 100 away from the light emitting unit 101.

In an embodiment of the present disclosure, the back pads 103 are provided corresponding to the first pad 1021 and the second pad 1022, respectively, for example, back pads 103 are respectively provided at positions directly below the first pad 1021 and the second pad 1022.

Further, the projected area of the back pad 103 on the substrate is smaller than the projected area of the first pad 1021 or the second pad 1022 on the substrate.

Meanwhile, in an embodiment of the present disclosure, the backlight module further includes a via hole 104. The via hole 104 is provided at a position corresponding to the back pad and the first and second pads 1021 and 1022. The via hole 104 extends through the substrate 100, the first pad 1021, the second pad 1022, and the back pad 103.

In an embodiment of the present disclosure, a metal material is further provided in the via hole 104. Specifically, the metal material may be metal such as copper, aluminum, or other metal material having excellent heat conduction and heat transfer properties. In the embodiment of the present disclosure, the metal material is described by using the copper layer 302 as an example. When the device is operated for a long time, the heat generated by the light emitting unit 101 may be dissipated by the first pad and the second pad, and at the same time, the heat is transferred to the back pad 103 through the copper layer 302, thereby effectively improving the heat dissipation performance of the module and ensuring normal operation of the device.

As shown in FIG. 4, FIG. 4 is a schematic structural diagram of the back pad. The back pad 103 is disposed corresponding to the pad on another side of the substrate. Preferably, the via hole 104 may be defined at a central location of each pad.

Specifically, the difference between the length of the back pad 103 and the length of the corresponding first pad 1021 or second pad 1022 ranges from 0.05 mm to 0.2 mm. Preferably, the length corresponding to the first pad 1021 or the second pad 1022 is set to 0.8 mm, and at the same time, the length of the back pad 103 is set to 0.7 mm. At this time, the length difference between the first pad 1021 or the second pad 1022 and the back pad 103 is 0.1 mm. The aperture of the via hole 104 is smaller than 0.2 mm, and preferably, the diameter of the via hole 104 is set to 0.15 mm.

Preferably, according to the size of each light emitting unit, the space between adjacent first and second pads ranges from 0.1 mm to 0.3 mm, and preferably, the space between the first and second pads 1021 and 1022 is set to be 0.2 mm. Therefore, better welding and heat dissipation effects are improved.

Meanwhile, in the embodiment of the present disclosure, for the back pads 103, the distance between two adjacent back pads 103 is set to range from 0.3 mm to 0.6 mm. Preferably, the distance between the two adjacent back pads 103 is set to 0.3 mm. Therefore, the distance between the back pads is larger than the distance between the pads on another side of the substrate, thereby improving the heat dissipation effect.

Figure 5:
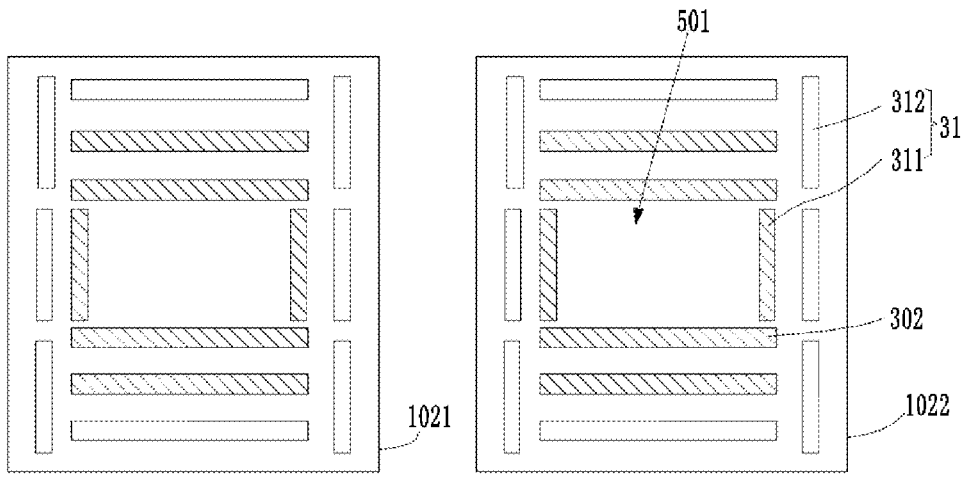
FIG. 5 is another schematic structural diagram of a pad according to an embodiment of the present disclosure.

As shown in FIG. 5, FIG. 5 is another structural diagram of a pad according to an embodiment of the present disclosure. In conjunction with the structures of the various parts shown in FIGS. 1 to 4, in an embodiment of the present disclosure, when the opening 31 is defined in the pad, the opening 31 may be defined along side edge of each pad, and at the same time, the opening 31 may be also defined directly at interior of each pad.

When the opening 31 is defined at the interior of the pad, as detailed in FIG. 5, the opening 31 includes a filling opening 311 and a non-filling opening 312. Specifically, a plurality of filling openings 311 and non-filling openings 312 are defined in each of the first pad 1021 and the second pad 1022. Meanwhile, the openings in the first pad 1021 and the second pad 1022 are symmetrically distributed.

Preferably, when the above-mentioned different openings are defined, a body portion of the pad corresponds to a central region 501 of the pad. In embodiments of the present disclosure, the body portion may be provided in a complete planar configuration. At the same time, both the filling opening 311 and the non-filling opening 312 are defined around the central region 501.

Specifically, during manufacturing, the filling openings 311 are defined at a side close to the central region 501. That is, the non-filling openings 312 may be disposed around the central region 501 and the filling openings 311. At the edge region of the pad, the non-filling openings 312 are defined.

Specifically, in an embodiment of the present disclosure, the copper layer 302 is filled in the filling opening 311. When more heat is generated inside the light emitting unit, excess heat may be directly transferred through the copper layer or the substrate in contact with each electrode, thereby effectively improving the heat dissipation performance of the module.

In the embodiment of the present disclosure, in a vertical direction of the first pad 1021, the filling openings 311 and the non-filling openings 312 are arranged parallel and at intervals, and at the same time, the filling openings 311 and the non-filling openings 312 are arranged with respect to the center of the center region 501 and toward the edge of the pad.

Meanwhile, in the embodiment of the present disclosure, in order to further improve the heat dissipation performance of the pad, an opening width of the filling opening 311 may be greater than an opening width of the non-filling opening 312 during manufacturing. In the embodiment of the present disclosure, a copper layer 302 is filled in the filling opening 311, and the copper layer 302 has good thermal conductivity. When more heat is generated inside the device, the heat may be rapidly transferred through the copper layer 302, for example, to the back pad to dissipate excess heat, thereby ensuring stability of the internal temperature of the device. The opening width of the filling opening 311 is greater than the opening width of the non-filling opening 312, so that more copper layers may be filled in the filling opening 311, thereby effectively improving the heat conduction and heat dissipation effect of the pad. In an embodiment of the present disclosure, the opening may be provided in the shape of a rectangular bar-shaped opening.

Accordingly, the back pad provided on another side of the substrate may be directly connected to the first pad or the second pad through the copper layer 302 filled in the corresponding filling opening.

Figure 6:
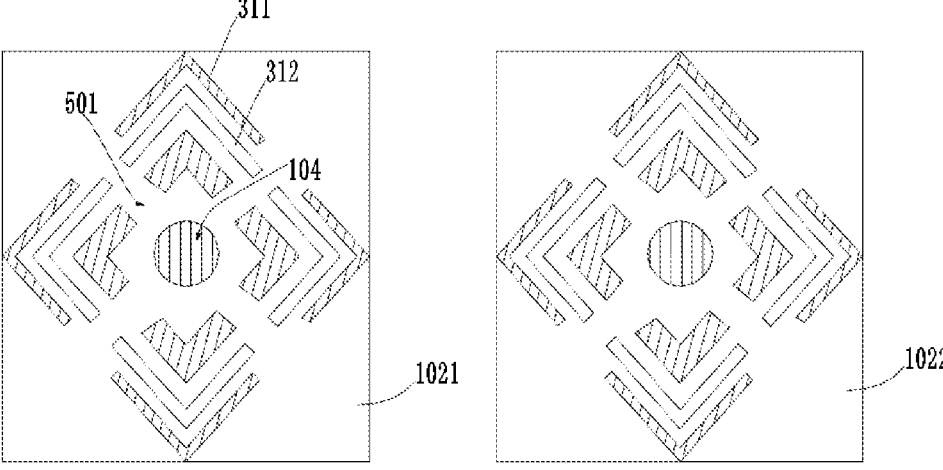
FIG. 6 is schematic structural diagram of still another pad according to an embodiment of the present disclosure.

As shown in FIG. 6, FIG. 6 is a schematic structural diagram of still another pad according to an embodiment of the present disclosure. In conjunction with the structures of various devices shown in FIGS. 1 to 5, in an embodiment of the present disclosure, when the first pad 1021 and the second pad 1022 are provided, each of the pads is provided with a via hole 104 and different openings.

Specifically, the via hole 104 is defined at a center position of each pad. For example, the via hole 104 is defined in the central region 501. At the same time, the openings include the filling openings 311 and the non-filling openings 312. In an embodiment of the present disclosure, the filling openings 311 and the non-filling openings 312 are all arranged around the via hole 104.

Preferably, the filling openings 311 and the non-filling openings 312 are arranged in layers at the periphery of the central region 501. That is, the filling openings 311 and the non-filling openings 312 are arranged in a multi-turn structure around the via hole 104, such as a multi-turn structure shown in FIG. 6.

In an embodiment of the present disclosure, the filling openings 311 and the non-filling openings 312 are discontinuous in each turn. That is, in the same turn, an unopened region is provided between the filling openings 311 or the non-filling openings 312.

Further, in an embodiment of the present disclosure, a width of the opening near the central region 501 may be greater than a width of the opening near the edge region.

In FIG. 6, the width of the filling opening 311 at the inner turn is larger than the width of the filling opening 311 at the edge region. At the same time, for each turn of openings, the spacing distance between two adjacent turns of openings may be different. Specifically, the distance between two adjacent turns of openings, at the edge region, is less than the distance between two adjacent turns of openings near the center region 501.

In the embodiment of the present disclosure, the openings corresponding to each turn together form a diamond-shaped structure. Preferably, on each pad, the number of the filling openings 311 and the number of the non-filling openings 312 may be set in accordance with the actual product, and details are not described herein.

In an embodiment of the present disclosure, the filling opening 311 is filled with a metallic material, and the interior of the non-filling opening 312 is not filled with any material. Thus, the heat inside the device is transferred through the metal material and the non-filling opening 312, and the temperature inside the panel is ensured to be constant.

Figure 7:
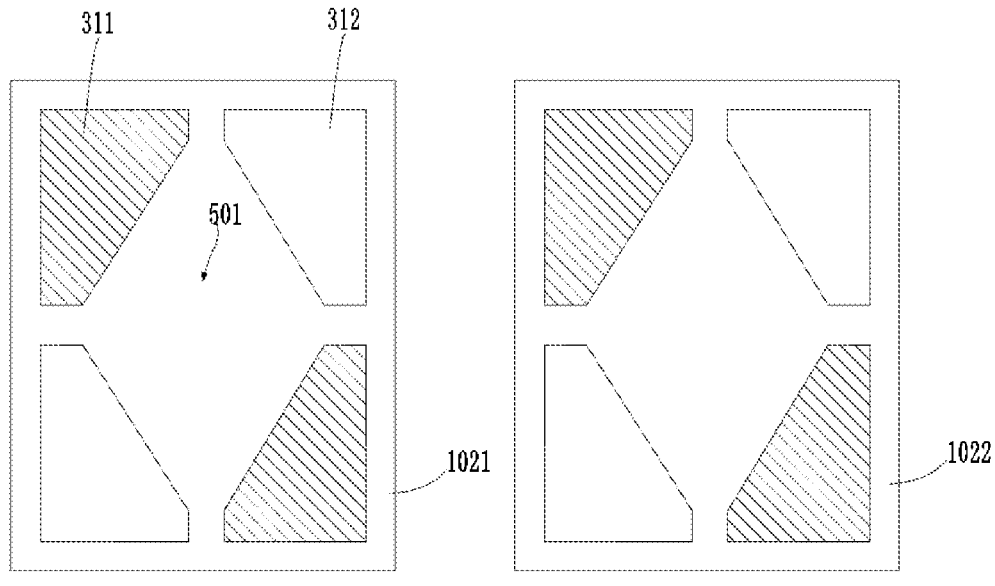
FIG. 7 is a schematic structural diagram of still yet another pad according to an embodiment of the present disclosure.

Further, as shown in FIG. 7, FIG. 7 is a schematic diagram of still yet another pad structure according to an embodiment of the present disclosure. Specifically, at least one opening 31 is defined in the first pad 1021 and the second pad 1022. The opening 31 is defined at the interior of the pad.

Specifically, the opening 31 includes a filling opening 311 and a non-filling opening 312. The filling opening 311 and the non-filling opening 312 are arranged around the central region 501. In an embodiment of the present disclosure, the filling opening 311 and the non-filling opening 312 may be arranged to be centrally symmetric with respect to the center of the pad.

Further, in order to improve the heat transfer effect of the pad and the openings, the openings are provided in a trapezoidal structure, and the trapezoidal openings are provided at the periphery of the central region 501, so that the central region 501 forms a diamond-shaped structure.

Meanwhile, the filling openings 311 are arranged at diagonal positions of the pads, respectively. A metal material is filled in each of the filling openings 311 to improve the heat dissipation effect. In this way, on the one hand, the welding effect of the pad may be effectively ensured, and at the same time, the heat dissipation performance of the pad may be ensured.

Preferably, a via hole structure may also be provided on each pad, wherein the specific location of the via hole structure is not limited, and the via hole structure may be provided directly at different locations in the central region 501. In an embodiment of the present disclosure, the entire pad is divided into a flat portion and an annular portion through the fill openings 311 and the non-fill openings 312. Specifically, the flat portion corresponds to a part of pad at the center region, the annular portion corresponds to a part of pad at the edge region, and the flat portion is electrically connected to the annular portion.

In an embodiment of the present disclosure, the structure of the pad is optimized so as to effectively improve the heat dissipation performance of the pad, ensure uniform distribution of the internal temperature of the device, and maintain stability.

Referring to FIG. 1, preferably, the light source module is further provided with a cover layer 107 in an embodiment of the present disclosure. The cover layer 107 may include a first cover layer 105 and a second cover layer 106.

The first cover layer 105 is disposed at least on the substrate 100, the second cover layer 106 is disposed on the substrate 100, and the second cover layer 106 completely covers the light emitting unit 101.

In an embodiment of the present disclosure, the thickness of the first cover layer 105 is smaller than that of the light emitting unit 101. Preferably, in an embodiment of the present disclosure, the material of the first cover layer 105 may include any one of white ink and reflective ink. Meanwhile, the material of the second cover layer 106 may include any one of silica gel and transparent glue. In the following embodiment, the first cover layer 105 is exemplified by white ink, and the second cover layer 106 is exemplified by encapsulating glue.

When the light emitting unit 101 emits light for a long time, the light emitted by the light emitting unit 101 is transmitted to the surface of white ink, and in an embodiment of the present disclosure, the white ink has good reflectivity, so that the white ink may reflect the light reaching the surface of the white ink. Therefore, the absorption of light by part of the film layer is reduced, thereby effectively reducing the accumulation of temperature in the film layer.

At the same time, in order to further improve the effect of the white ink or other reflective material, reflective particles or grains may be added to the white ink or reflective material, for example, reflective particles such as silicon dioxide may be added to the white ink or reflective material, thereby further improving the effect of the white ink or other reflective material, and effectively ensuring the temperature inside the panel. The problem that the encapsulating glue turns yellow under long-time illumination is prevented.

In an embodiment of the present disclosure, the light reflectivity of the surface of the first cover layer 105 is greater than 80%. Meanwhile, the light transmittance corresponding to the first cover layer 105 is less than 90%. Meanwhile, in an embodiment of the present disclosure, the material of the substrate may be a resin material. The thermal conductivity of the resin material corresponding to the substrate may be 0.1 W/mK to 2 W/mK.

Further, the light source modules were prepared according to the above-mentioned materials and film layer structures, and the light decay value and the service life of the light source modules were measured. As shown in Table 1 below:

| Light Decay Test: 10 mA, Ta = 85° C., Integrating Sphere Test | | | | | | |
|---|---|---|---|---|---|---|
| | T0 | T216 | T264 | T744 | T1000 | Integrating ball test |
| Scheme | 100% | 101.5% | 101.5% | 99.5% | 98.7% | T1000 > 95% T700 > 97% |

Different test times corresponding to the light source modules were 0, 216 hours, 264 hours, 744 hours, 744 hours and 1000 hours, respectively, under the light decay test conditions of 10 mA and 85°. It can be seen that after the long-term light decay test, the integral sphere values corresponding to the light source modules were all greater than 97%, and still had high values. Meanwhile, the colors of the second cover layer 106 and the light emitting unit were observed, and no yellowing or other color changes occurs on the surface of the second cover layer 106 and the light emitting unit. However, the device prepared in the prior art generally suffers from yellowing and severe aging problems under a long-term test. At the same time, the corresponding light transmittance is still high, and each film layer maintains high overall performance. Therefore, the light source modules prepared in the embodiments of the present disclosure has good quality and comprehensive performance.

Specifically, when the materials of the first cover layer 105 and the second cover layer 106 are selected, the first cover layer 105 may be a material from Taiyo ink, such as the product PSR-2000-CE800W. The second cover layer 106 may be 5970 glue from Dow Corning. Meanwhile, the material of the substrate may be selected as a polystyrene plate material, thereby effectively improving the quality and comprehensive performance of the light source module formed by the preparation.

Further, in an embodiment of the present disclosure, there is further provided a display device in which the light source module is provided. The structure in the light source module is arranged in the manners provided in the embodiments of the present disclosure. The display device may be any product or component having a display function and a touch function, such as a mobile phone, a computer, an electronic paper, a display, a notebook computer, or a digital photo frame, the specific type of which is not specifically limited.

In view of the foregoing, a light source module and a display device according to an embodiment of the present disclosure have been described in detail. The principles and implementation of this disclosure are described by using specific examples in this disclosure. The description of the above embodiments is merely intended to help understand the technical solutions and core ideas of the present application. Although the present disclosure has been described in terms of preferred embodiments, the foregoing preferred embodiments are not intended to limit the present disclosure. Those skilled in the art will be able to make various changes and modifications without departing from the spirit and scope of the present disclosure, and therefore the protective scope of the present disclosure is based on the scope defined in the claims.

What is claimed is:

1. A light source module comprising:
   a substrate;
   a pad portion disposed on the substrate, wherein the pad portion comprises a first pad and a second pad, a gap is formed between the first pad and the second pad, the first pad is provided with at least one first opening, and the second pad is provided with at least one second opening symmetrical to the at least one first opening about the gap; and
   a light emitting device disposed at least on the first pad and the second pad,
   the pad portion further comprises a first back pad and a second back pad that are disposed on a side of the substrate away from the light emitting device to be opposite to the first pad and the second pad, respectively; and
   the light source module further comprises a first via hole extending through the first pad, the substrate and the first back pad, and a second via hole extending through the second pad, the substrate and the second back pad, and each of the first via hole and the second via hole is filled with thermally conductive metal material;

the first pad comprises a first flat portion and a first annular portion surrounding and electrically connected to the first flat portion; the at least one first opening comprises two first openings disposed in a region between the first annular portion and the first flat portion to be centrally symmetric about a center of the first pad; and the second pad comprises a second flat portion and a second annular portion surrounding and electrically connected to the second flat portion; and the at least one second opening comprises two second openings disposed in a region between the second annular portion and the second flat portion to be centrally symmetric about a center of the second pad.

2. The light source module according to claim 1, wherein the at least one first opening extends from a side edge of the first pad close to the gap toward a middle region of the first pad, and the at least one second opening extends from a side edge of the second pad close to the gap toward a middle region of the second pad.

3. The light source module according to claim 1, wherein an area of the first back pad is smaller than an area of the first pad, and an area of the second back pad is smaller than an area of the second pad.

4. A light source module comprising:

a substrate;

a pad portion disposed on the substrate, wherein the pad portion comprises a first pad and a second pad, a gap is formed between the first pad and the second pad, the first pad is provided with at least one first opening, and the second pad is provided with at least one second opening; and a light emitting device disposed at least on the first pad and the second pad, wherein the pad portion further comprises a first back pad and a second back pad that are disposed on a side of the substrate away from the light emitting device to be opposite to the first pad and the second pad, respectively; and the light source module further comprises a first via hole extending through the first pad, the substrate and the first back pad, and a second via hole extending through the second pad, the substrate and the second back pad, and each of the first via hole and the second via hole is filled with thermally conductive metal material;

the first pad comprises a first flat portion and a first annular portion surrounding and electrically connected to the first flat portion; the at least one first opening comprises two first openings disposed in a region between the first annular portion and the first flat portion to be centrally symmetric about a center of the first pad; and the second pad comprises a second flat portion and a second annular portion surrounding and electrically connected to the second flat portion; and the at least one second opening comprises two second openings disposed in a region between the second annular portion and the second flat portion to be centrally symmetric about a center of the second pad.

5. The light source module according to claim 4, wherein the at least one first opening extends from a side edge of the first pad close to the gap toward a middle region of the first pad, and the at least one second opening extends from a side edge of the second pad close to the gap toward a middle region of the second pad.

6. The light source module according to claim 4, wherein the light source module further comprises: a cover portion disposed on the substrate and covering the light emitting device, wherein the cover portion comprises:

a first cover layer disposed at least on the substrate;

a second cover layer disposed at least on the first cover layer; and wherein the first cover layer is disposed around the light emitting device, and the second cover layer covers the light emitting device.

7. The light source module according to claim 6, wherein the first cover layer comprises any one of white ink and reflective ink, and the second cover layer comprises any one of silica gel and clear glue.

8. A display device comprising:

a light source module; and a functional film layer disposed on the light source module;

wherein the light source module is configured to provide light to the functional film layer, and the light source module comprises:

a substrate;

a pad portion disposed on the substrate, wherein the pad portion comprises a first pad and a second pad, a gap is formed between the first pad and the second pad, the first pad is provided with at least one first opening, and the second pad is provided with at least one second opening; and a plurality of light emitting devices arranged in an array on the substrate, one of the light emitting devices being disposed at least on the first pad and the second pad, wherein the pad portion further comprises a first back pad and a second back pad that are disposed on a side of the substrate away from the light emitting device to be opposite to the first pad and the second pad, respectively; and the light source module further comprises a first via hole extending through the first pad, the substrate and the first back pad, and a second via hole extending through the second pad, the substrate and the second back pad, and each of the first via hole and the second via hole is filled with thermally conductive metal material;

the first pad comprises a first flat portion and a first annular portion surrounding and electrically connected to the first flat portion; the at least one first opening comprises two first openings disposed in a region between the first annular portion and the first flat portion to be centrally symmetric about a center of the first pad; and the second pad comprises a second flat portion and a second annular portion surrounding and electrically connected to the second flat portion; and the at least one second opening comprises two second openings disposed in a region between the second annular portion and the second flat portion to be centrally symmetric about a center of the second pad.

* * * * *